United States Patent [19]

Dice

[11] 4,145,620
[45] Mar. 20, 1979

[54] MODULAR DYNAMIC BURN-IN APPARATUS

[75] Inventor: Charles A. Dice, Milpitas, Calif.

[73] Assignee: Serel Corporation, Milpitas, Calif.

[21] Appl. No.: 839,665

[22] Filed: Oct. 5, 1977

[51] Int. Cl.² .......................................... H02J 13/00
[52] U.S. Cl. ............................. 307/149; 324/73 PC; 361/415
[58] Field of Search ...................... 307/149; 361/415; 324/73 PC

[56] References Cited

U.S. PATENT DOCUMENTS 3,939,381   2/1976   Meany .................................. 361/402

Primary Examiner—Gene Z. Rubinson
Assistant Examiner—Morris Ginsburg
Attorney, Agent, or Firm—Schatzel & Hamrick

[57] ABSTRACT

A modular-type integrated circuit burn-in apparatus including a power supply for developing integrated circuit biasing potentials, an oven and a plurality of modules each having a plug-in pattern generator for generating integrated circuit exercising signals of a type programmed by a first plug-in header, a plurality of driver cards for fault monitoring and for developing amplified exercising signals on output pins programmed by a second plug-in header, a plurality of socket cards carrying the integrated circuits to be burned-in, and with said modules being removably disposed in a rear wall of the oven having connectors on the outside of the oven for receiving the pattern generator and the driver cards, and connectors on the inside of the oven for receiving the socket cards, the modules being operative to couple the power from the power supply to the pattern generator and the driver cards, the exercising signals from the pattern generator to the driver cards, and the amplified exercising signals and power from the driver cards to the socket cards whereby the type of exercising signals and routing of the power and exercising signal are programmed by the headers as required by the type of integrated circuits to be burned-in.

5 Claims, 3 Drawing Figures

Fig_1

MODULAR DYNAMIC BURN-IN APPARATUS

BACKGROUND OF THE INVENTION

1. Field of the Invention

The present invention relates generally to integrated circuit testing apparatus, and more particularly to a modular programmable integrated circuit burn-in apparatus.

2. Description of the Prior Art

Numerous integrated circuits which appear to function satisfactorily at first have hidden defects which cause them to fail after a short period of actual operation. If such devices are not identified prior to being installed in an ultimate product, their eventual failure may be very costly later both in repair time and down time.

To promote early failure for screening, many integrated circuits are "burned-in." Burn-in is usually accomplished by exercising the device while it is held in an oven at an elevated temperature. The heat and exercising stimulus cause the defective device to fail in a much shorter period of time than would otherwise be required.

It will be appreciated that to burn-in integrated circuits economically, typically thousands of such devices must be burned-in at one time. Each one of the devices must be provided with one or more biasing potentials and stimulation signals appropriate for the particular device type.

In addition, since many integrated circuits are sensitive to the order in which the biasing potentials and signals are applied, provision must be included to sequence these signals appropriately.

Finally, provisions must be included to prevent shorted integrated circuits or a failed portion of the apparatus from developing signals which could result in the destruction of otherwise good devices or the apparatus itself. Preferably, sensing and isolating such shorts should be accomplished at as low a signal level as possible.

A problem arises when such an apparatus has been constructed to generate and distribute to the multitude of integrated circuit socket pins the appropriate signals for a first integrated circuit type and it then becomes desirable to burn-in a second device type having a different pin configuration or different signal requirements.

One prior art solution uses separate stimulation signal generation and distribution boards configured and dedicated for each integrated circuit type to be burned-in. This solution, however, necessitates a sizeable investment for a large inventory of the expensive boards.

The use of transferrable interconnecting wires or adjustable controls, such as might be associated with the bias potential generating supplies, although tending to make the apparatus more adaptable and permitting the bias potentials to be sequenced, increases the possibility of operator error which could result in mass destruction of the integrated circuits.

SUMMARY OF THE INVENTION

It is therefore a principal object of the present invention to provide an integrated circuit burn-in apparatus which may be quickly and economically configured to test any of several different device types.

Another object of the present invention is to provide a burn-in apparatus which detects, isolates and permits easy rectification of faults at a low level.

Briefly, the preferred embodiment of the present invention includes a power supply and a burn-in chamber. The power supply includes a plurality of sources of power and a sequencer having a plug-in sequencer programming card for controlling the power sources.

The chamber includes an oven and a plurality of bay modules each having a plug-in pattern generator, a plurality of plug-in driver cards and a plurality of plug-in socket cards. The bay modules, which are removably disposed in the rear wall of the oven, have externally mounted connectors which include a power supply coupling connector, a pattern generator receiving connector, and a plurality of driver card receiving connectors. The bay modules also have a plurality of internally mounted socket card receiving connectors.

The pattern generators each have plug-in programming headers and circuitry for developing integrated circuit exercising signals which are programmed by the headers. The driver cards each have circuitry for amplifying the exercising signals and monitoring the signals for a fault condition and plug-in programming headers for programming the routing of the amplified exercising signals. The socket cards have sockets for receiving a plurality of integrated circuits to be burned-in.

When energized, each bay module couples power from the power supply to the pattern generator and the driver cards, couples exercising signals from the pattern generator to the driver cards, and couples the amplified exercising signals as well as power from the driver cards to the socket cards. The type of exercising signals and the routing to the sockets of the amplified exercising signals and the power is programmed by the headers as required for the type of integrated circuits to be burned-in.

The use of a plug-in sequencer programming card and plug-in programming headers for rapidly, economically and safely adapting the apparatus to test numerous integrated circuit types is a material advantage of the present invention.

Another advantage of the present invention is its modular configuration which facilitates repairs.

These and other objects and advantages of the present invention will no doubt become apparent to those of ordinary skill in the art after having read the following detailed description of the preferred embodiment illustrated in the several figures of the drawing.

IN THE DRAWING

DETAILED DESCRIPTION OF THE PREFERRED EMBODIMENT

Figure 1:
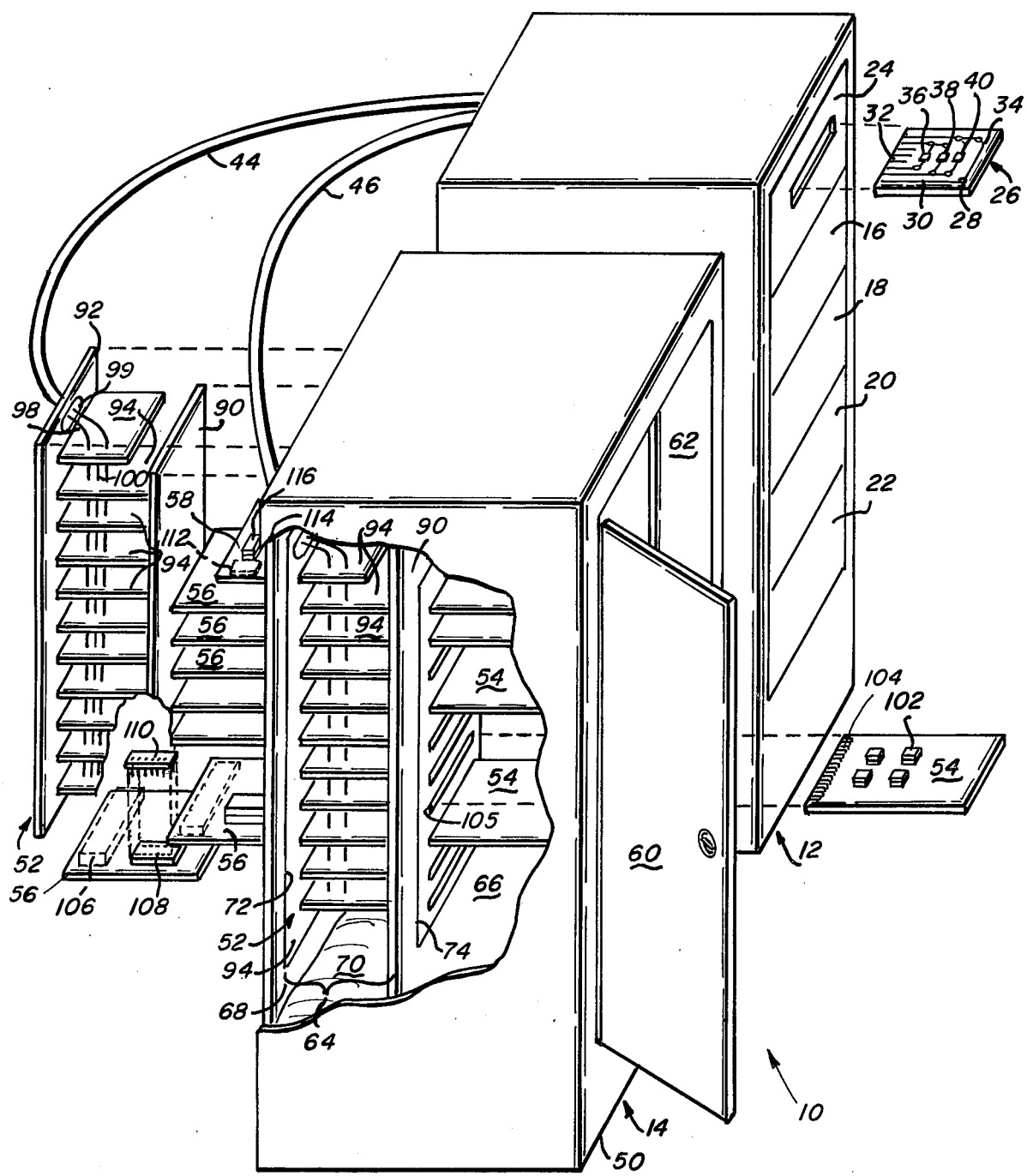
FIG. 1 is a perspective view generally illustrating the principal components of a modular dynamic burn-in apparatus in accordance with the present invention.

Referring to FIG. 1, a preferred embodiment of a modular dynamic burn-in apparatus 10 is shown comprising a power supply 12 and a burn-in chamber 14. The power supply includes a number of sources of potential appropriate for biasing the integrated circuits to be burned-in. Since many integrated circuits require three or four different biasing potentials, four potential sources 16, 18, 20 and 22 are included in the preferred embodiment. The power supply also includes a sequencer 24.

Each potential source includes suitable thermal overload, overvoltage and circuit breaker protection. Typically, potential source 16 is capable of providing from zero to thirty volts at a current of up to two hundred amps. Potential source 18 is also capable of providing from zero to thirty volts at up to one hundred amps, and potential sources 20 and 22 are both capable of providing from zero to twenty volts at up to twenty-five amps. The voltage programming and sequencing of the potential sources is under the control of sequencer 24.

Sequencer 24 includes a plug-in sequencer programming card 26, having a number of solder pads coupled by printed circuit traces to contacts of a printed circuit card edge connector engaging finger portion, typified by a pad 28, a trace 30 and a contact 32. Coupling various ones of the pads are jumpers, as illustrated by a jumper 34 and resistors, as illustrated by three resistors 36, 38 and 40. The pattern of the jumpers and the resistance of the resistors are operative to program the sequencer.

Since many integrated circuits, which are to be burned-in, are sensitive to the order in which the bias potentials are applied, as determined by the jumpers installed on the sequencer programming card 26, sequencer 24 is operative to control the order in which the potential sources are energized.

Specifically, various of the delayed outputs of a clock-driven shift register in sequencer 24 are coupled by an edge connector to some of the traces on programming card 26. The jumpers interconnect these traces with ones controlling the power sources. When the power supply is activated, the shift register is shifted in a first direction sequentially filling the register which sequentially energizes the power sources. On power down, the shift register is shifted in the other direction emptying the register which sequentially deenergizes the power sources.

The sequencer sets the operating voltage of each of the sources of potential and monitors these voltages for a fault condition. If a potential source voltage exceeds or drops below a first or second preset source limit, the sequencer is operative to shut down all of the potential sources to protect the integrated circuits under test. The nominal, maximum and minimum voltage levels for each potential source are determined by the resistance of first, second and third resistors on the programming card, such as resistors 36, 38 and 40, respectively.

Biasing potentials developed by power supply 12 are routed by a pin programmable matrix board to various lines in each of ten buses which are connected to the burn-in chamber 14. Two of the busses, a bus 44 and a bus 46, are shown.

It will thus be seen that when it becomes desirable to change the operative parameters of power supply 12 from a first set of conditions appropriate for a first type of integrated circuit to be burned-in to a second set of conditions appropriate for a second type of integrated circuit, it is only necessary to change the location of the jumpers and the resistance of the resistors on programming card 26 or preferably to replace the programming card with one appropriately configured.

Although in the preferred embodiment, programming card 26 includes hard wired jumpers and resistors, an integrated circuit socket and an appropriately wired programming header may also be employed.

Burn-in chamber 14 includes an oven 50 and a number of bay modules 52, each for receiving a number of socket cards 54, a similar number of universal driver cards 56, and a pattern generator card 58. Oven 50 is a temperature controlled burn-in chamber or oven including an electric heater, temperature regulator, and an air circulating fan for maintaining the integrated circuits at a preset temperature. An example of such an oven is the one designated BBC2-24 which is manufactured by Despatch Oven Company.

In order to more clearly illustrate the various components of the burn-in chamber, oven 50 is not drawn to scale. Typically, the oven has a height of approximately seven feet, a width of approximately seven feet and a depth of approximately three feet. Due to the space occupied by the insulation and heating components, the usable internal chamber area is approximately four feet in width and three feet in height, and is disposed laterally and approximately one foot from the top of the oven.

The front of the oven is enclosed by a pair of doors including a door 60 and a door 62. Typically, the doors are approximately four inches thick and filled with insulation. The rear of the chamber is enclosed by a removable door-like member 64.

Member 64 has an inner wall 66 and an outer wall 68 disposed approximately four inches apart and also filled with insulation 70.

Located in the outer wall 68 and insulation 70 are two ranks of five vertically-disposed rectangular cut-outs as typified by cut-out 72. Each of the cut-outs are suitable for receiving one of the bay modules 52. Forward of each cut-out in wall 66 is located a smaller vertically-disposed rectangular cut-out, as illustrated by cut-out 74, for permitting the communication of ten of the universal socket cards 54 with each of the bay modules.

Bay module 52 includes a first or front rectangular panel 90, a second or rear rectangular panel 92, and eleven signal distribution cards 94. Rear panel 92 is slightly larger than rectangular opening 72, permitting it to snugly mate with the outer or rear surface of outer wall 68 where it is held by a number of bolts (not shown).

The front rectangular panel 90 is slightly smaller than either panel 92 or cut-out 72, but larger than cut-out 74, permitting it to pass through cut-out 72 to snugly mate against the rear surface of the inner wall 66, where it is also affixed by suitable mounting bolts (also not shown).

Ten of the signal distribution cards 94 are disposed between the two panels 90 and 92 where they terminate in printed circuit board edge connectors. Each distribution card 94 is suitable for routing signals from an edge connector at panel 92 to the respective one at panel 90. The eleventh signal distribution card 94 is terminated in a printed circuit board edge connector at the rear panel 92 only.

Wires including a wire 98 are routed from a feed-through type terminal connector strip 99 having a plurality of terminals 99A, connected to bus 44, through each of the signal distribution cards 94 for carrying power supply bias potentials from the connector strip to each signal distribution card 94 where they are electrically connected to the printed circuit board edge connector at the rear panel 92 and also at the front panel 90. Other wires such as wire 100, which are connected to each signal distribution card 94 couple signals that are coupled by the eleventh signal distribution card from its printed circuit board edge connector to the other signal distribution cards to be coupled to their respective printed circuit board edge connector at the rear panel 92.

The socket cards 54 each include ninety-six integrated circuit sockets, represented by a socket 102, disposed as sixteen ranks of six sockets. In a universal configuration, the sockets are connected in parallel by printed circuit traces which also connect the sockets to a printed circuit board edge connector engaging a finger portion 104. In a dedicated configuration, the socket pins are connected to the fingers, as appropriate for the integrated circuit device type to be burned-in. Each socket card is designed to be plugged into one of the edge connectors 150 located along the front rectangular panel 90 of a bay module 52 for receiving appropriate power supply biasing potentials and exercising signals.

Each universal driver card 56 contains circuitry as indicated at 106 suitable for buffering, fault detecting and routing signals. Each driver card when installed in one of the edge connectors located at the rear panel 92 of one of the bay modules 52 receives exercising signals generated by a pattern generator card and power supply biasing potentials, which are routed by wires 98 and 100 respectively. The driver card buffers the signals to generate amplified signals for driving one of the socket cards.

Each one of the driver cards 56 also includes fault detection circuitry suitable for detecting a current overload condition which might result from a failure of one of the associated integrated circuits being burned-in or from a failure of the respective signal distribution card 94 or the socket card 54. The driver card in response to the detection of such an overload condition removes all biasing potentials and exercising signals intended for the respective socket card.

Each driver card 56 also includes three sockets, each suitable for receiving a header containing a preprogrammed array of interconnecting wires, although only a socket 108 and a header 110 are visible in this figure. The headers control the distribution of the biasing potential and exercising signals with respect to the pins of the edge connector on panel 90 and thus to the various pins of the integrated circuit sockets on the respective socket card 54. It will thus be seen that a change in the routing of signals necessary to accommodate a change in the type of integrated circuits being burned-in on one of the socket cards may be accomplished by changing the headers.

Although sockets and plug-in headers are the preferred programming means, printed circuit board edge connectors for receiving programming plug-in printed circuit cards may also be employed.

Each pattern generator 58 contains suitable circuitry illustrated at block 112 for generating exercising signals and three sockets for receiving a forty-pin, a sixteen-pin, and a fourteen-pin header. Only the forty-pin socket 114 and its header 116 are visible. When biased by suitable potentials coupled from the power supply by bus 44, the wires including wire 98, and its respective signal distribution card, the pattern generator develops appropriate exercising signals as programmed by the wires interconnecting various ones of the pins of the three headers. Changing of the exercising signals as required by changes in the integrated circuit type which are being burned-in may be accomplished by changing the appropriate headers. Again, edge connectors for receiving plug-in programming cards may also be employed.

Operationally, appropriate headers are installed in the universal driver cards 56 and the pattern generator card 58, which are installed in the bay modules, and an appropriate sequencer programming card 26 is installed in the sequencer. Next, the integrated circuits to be burned-in are installed in the various sockets 102 of the socket cards 54, and the cards are installed in various ones of the printed circuit board edge connectors in the front panels of the various bay modules 52 in oven 50. Although various types of devices may be burned in simultaneously, all devices driven by one bay module must have similar exercising signal requirements for dynamic burn-in conditions.

When the burn-in apparatus is energized, sequencer 24 will sequentially cause potential sources 16, 18, 20 and 22 to develop the appropriate power supply biasing potentials for connection by the buses to the various bay modules 52. In response to the biasing potentials, each pattern generator card 58 will generate suitable exercising signals for the integrated circuit type which is installed in its respective bay module. These power supply biasing potentials and exercising signals will be buffered, monitored and distributed by the various universal driver cards 56 in that bay module for distribution by the signal distribution cards 94 to the appropriate socket cards 54, one driver card driving one socket card through one distribution card. Should a fault occur, the appropriate driver card 56 will isolate the fault by removing all of the biasing and exercising signals from the respective socket card 54.

Figure 2:
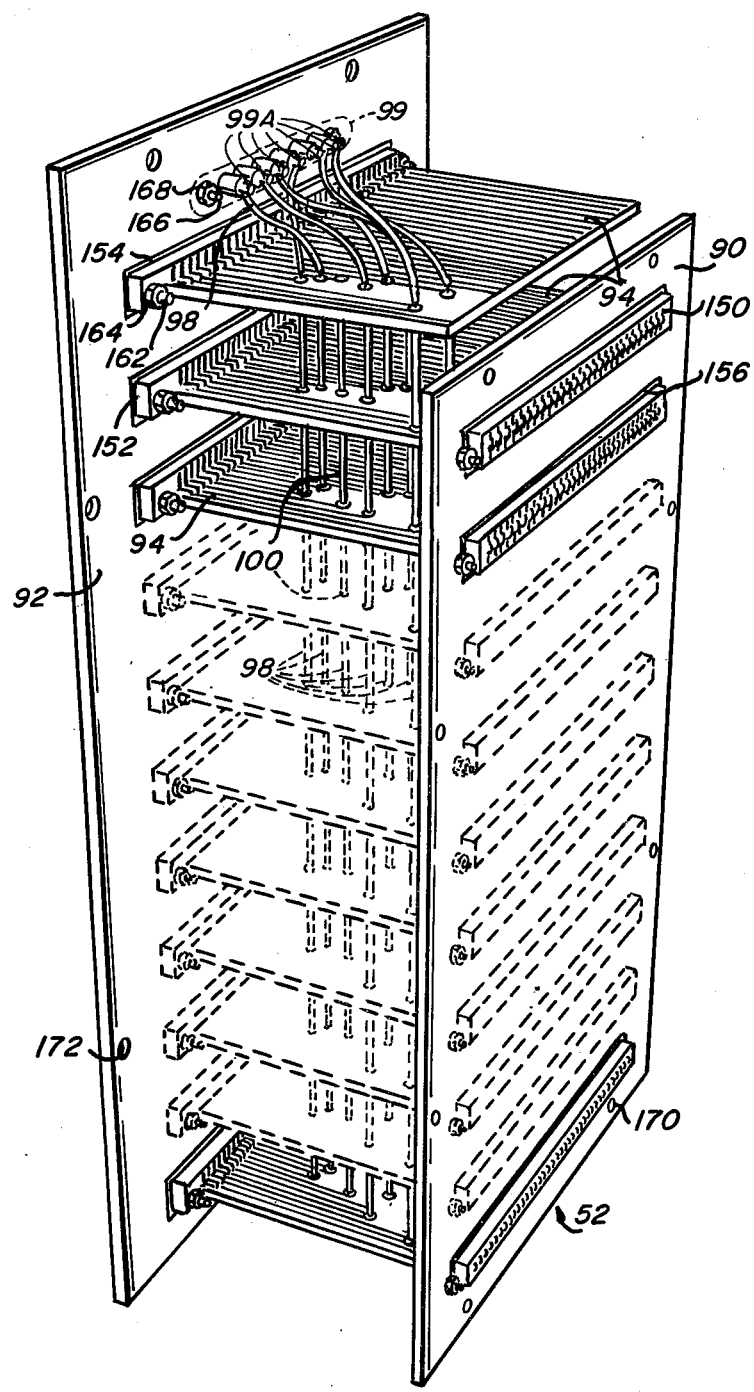
FIG. 2 is a perspective view further illustrating a bay module shown in FIG. 1.

A perspective view generally illustrating one of the bay modules 52 is shown in FIG. 2. The principal components of the bay module include the front and rear panels 90 and 92, twenty-one printed circuit board edge connectors including edge connectors 150, 152 and 154, the eleven signal distribution cards 94 and terminal strip 99. The twenty-one edge connectors are disposed in twenty-one equally-spaced parallel slots, ten in front panel 90 and eleven in rear panel 92 as typified by a slot 156. The edge connectors are retained in the slots by suitable bolts and nuts including a bolt 162 and a nut 164.

Retained between the pins of edge connectors 150 and 152 is one of the signal distribution cards 94. The signal distribution card is maintained in position by a solder connection between the connector pins and traces on the distribution card. Except for the eleventh distribution card which is attached to only edge connector 154, the other distribution cards are mounted in a similar fashion. The ten signal distribution cards and their edge connectors are also effective to maintain panels 90 and 92 in a spaced-apart relationship.

The signal distribution cards 94 have printed circuit traces, the majority of which run directly between the pins of the edge connectors attached to panel 92 and those located in a similar position on the edge connector attached to panel 90. A number of the traces, however, run from the pins of the edge connector attached to panel 92 to solder pads on the distribution card.

A number of wires connect similarly disposed pads on the respective signal distribution cards 94. A first portion of the wires, including wire 100, connect signals from the program generator card 58 to the various signal distribution cards 94 and thus to the universal driver cards 56. A second portion of the wires including wire 98 are also connected to the various ones of the terminals 99A on terminal strip 99 for coupling the power supply biasing potentials to the various distribution cards 94 for connection to the program generator card 58, the driver cards 56, and the socket card 54.

Located in a suitable cut-out in rear panel 92, the feed through terminal strip, or connector 99 is retained by two bolts and nuts including a bolt 166 and a nut 168.

The front and rear panel 90 and 92 also includes a number of holes as illustrated at 170 and 172 for attaching the bay module to the outer and inner walls of the oven.

Figure 3:
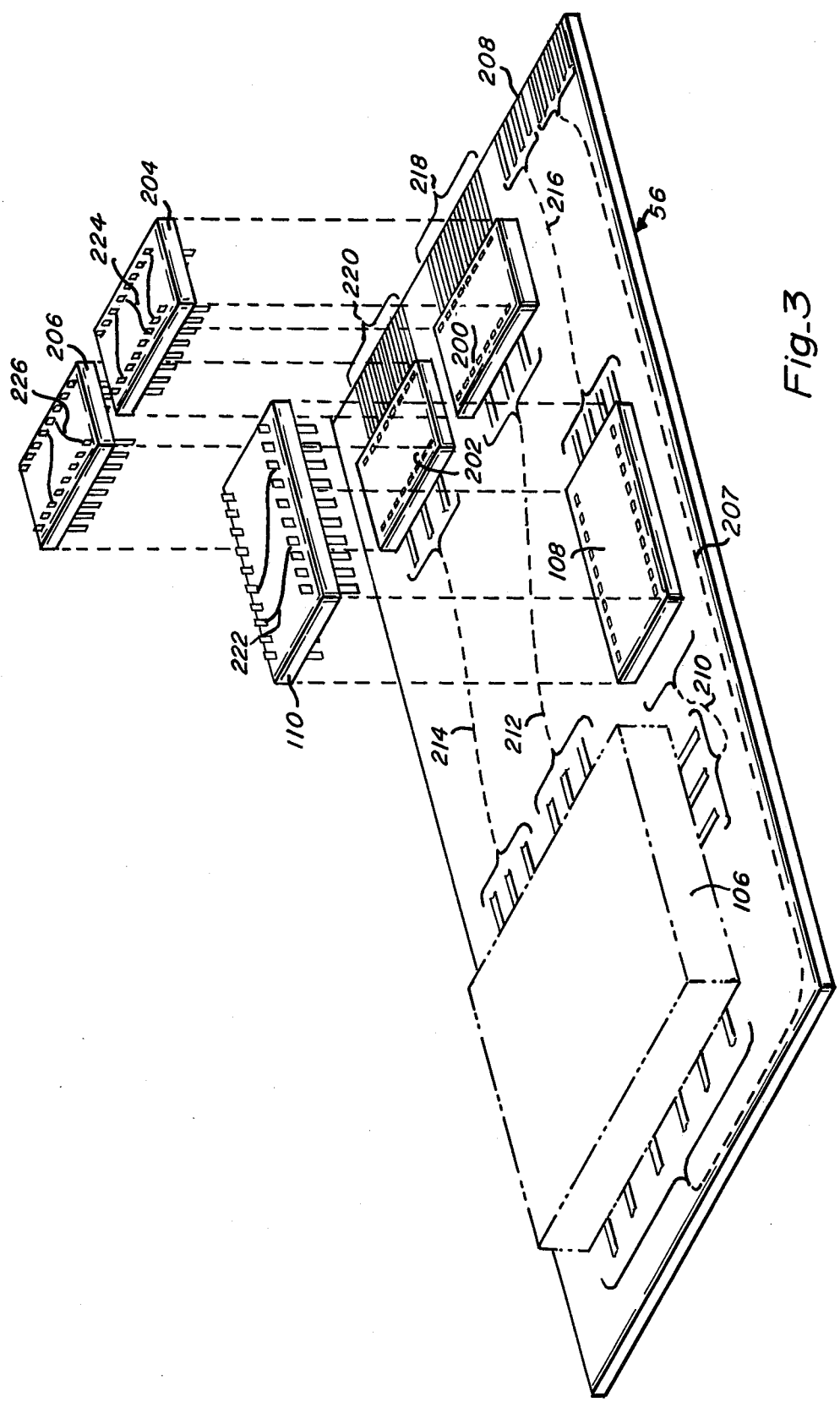
FIG. 3 is a partial schematic and perspective view generally illustrating a driver card shown in FIG. 1.

In FIG. 3, a universal driver card 56 is illustrated in schematic representation. The driver card 56 includes the amplifier/detector circuitry represented by the dashed block 106, and three integrated circuit sockets 108, 200 and 202, each for receiving one of the three plug-in programming headers 110, 204 and 206.

The circuitry includes a high current buffer/amplifier for each exercising signal developed by the associated pattern generator card 58. Twenty such buffer/amplifiers are used in the preferred embodiment. Each buffer/amplifier drives a sensing circuit which monitors the load on the buffer/amplifier for detecting a fault condition.

In the preferred embodiment, each signal sensing circuit includes a current sensing resistor connected from its respective buffer/amplifier output to an amplified/detected output. Connected across each sensing resistor is the base-emitter junction of a first NPN transistor and the base-emitter junction of a second PNP transistor.

Each bias sensing circuit includes a bias current sensing resistor connected in series with its respective incoming PC trace from the driver card connector. Connected across each of these resistors is the base-emitter junction of a first NPN transistor and the base-emitter junction of a second PNP transistor.

The transistor collectors drive, in the preferred embodiment, a relay which, in response to a fault, disconnects all exercising and biasing signals from the associated socket card. The circuitry also includes suitable fuses, LED indicators, and provisions for triggering a sonic alarm for further protecting the system and providing indication of system operation.

The circuitry receives exercising and biasing signals which are routed directly by printed circuit traces indicated at 207 from some of the printed circuit card fingers including a finger 208 on the edge of the card. (The number and position of the traces and fingers are representative only.) The amplified/detected signals developed by the circuitry are coupled by printed circuit traces illustrated at 210, 212 and 214 to a first portion of the pins of the sockets 108, 200 and 202. A second portion of the pins of the sockets are routed by traces illustrated at 216, 218 and 220 to other fingers on the edge of the board. Interconnections on the plug-in headers including wires 222, 224 and 226 are effective to interconnect the first and second portions of the integrated circuit pins and thus program the interconnection of the amplified/detected signals with the fingers.

Although representing one of the driver cards, FIG. 3 is also typical of a program generator card, except for the interconnections of the exercising signal generating circuitry, the header-receiving sockets, and the fingers, which are discussed above.

It is contemplated that after having read the preceding disclosure certain other alterations and modifications of the present invention will become apparent to those skilled in the art. It is therefore intended that the following claims be interpreted to cover all such alterations and modifications as fall within the true spirit and scope of the invention.

What is claimed is:

1. A system for generating exercising signals for an integrated circuit burn-in apparatus comprising:
  power supply means for developing integrated circuit biasing potentials;
  an oven for receiving a plurality of integrated circuits to be burned-in;
  a plurality of modules each having a plug-in pattern generator for generating integrated circuit exercising signals of a type programmed by a first plug-in header;
  a plurality of driver cards for fault monitoring and for developing amplified exercising signals on output terminals programmed by a second plug-in header;
  a plurality of socket cards for carrying the integrated circuits to be burned-in, and
  a module removably disposed in a rear wall of the oven, the module having connectors on the outside of the oven for receiving the pattern generator and the driver cards and connectors on the inside of the oven for receiving the socket cards, the module being operative to couple the power from the power supply means to the pattern generator and the driver cards, to couple the exercising signals from the pattern generator to the driver cards, and to couple the amplified exercising signals and power from the driver cards to the socket cards whereby the type of exercising signals and routing of the power and exercising signal are programmed by the headers as required by the type of integrated circuits to be burned-in.

2. A system for generating exercising signals for an integrated circuit burn-in apparatus comprising:
  power supply means for developing at least one power supply potential for biasing integrated circuits;
  a signal distributor having a first connector with first terminals for connection to said power supply means, a second connector having second and third terminals with said second terminals being connected to said first terminals, a plurality of third connectors each having fourth terminals, fifth terminals and sixth terminals with said fourth terminals being connected to said first terminals and said fifth terminals being connected to said third terminals and a plurality of fourth connectors each having seventh terminals and eighth terminals with said seventh terminals coupled to said sixth terminals and said eighth terminals coupled to said first terminals;
  a plug-in pattern generator for mating with said second connector and including a pattern generation circuit connected to receive power on said second terminals, and for generating integrated circuit exercising signals on the third terminals, the pattern generator further including a first header for programming the exercising signals;
  a plurality of plug-in driver cards including circuitry for fault monitoring and for developing amplified exercising signals, each driver card including a second header for programming the routing of said amplified exercising signals to said fourth connectors, a buffer circuit connected to receive said exercising signals and power from said power supply means, said buffer circuit being operative to generate amplified exercising signals, and a plurality of socket boards for connection to said fourth connectors and for receiving integrated circuits to be burned-in and for receiving said amplified exercising signals and said power and for selectively delivering said exercising signals and power to said integrated circuits on said socket boards;

whereby said signal distributor is operative to couple power from said power supply means to said pattern generator causing said pattern generator to generate said exercising signals, to couple power from said power supply means and said exercising signals to said driver cards causing said driver cards to develop said amplified exercising signals and power and to couple said amplified exercising signals and power to said socket boards containing the integrated circuits to be burned-in.

3. A system for generating exercising signals as recited in claim 2 wherein said power supply means include a first source of potential coupled to said first connector, a second source of potential coupled to said first connector, and a sequencer connected to said first and second potential sources and having a plug-in sequencer programming card means whereby said sequencer is operative to control the level of the potentials generated by said first and second of sources and operative to control the order of energization of said first and second potential sources both in a predetermined manner as programmed by said programming card means.

4. A system for generating exercising signals as recited in claim 2 wherein said buffer circuit further includes fault detecting means responsive to the loading of the buffer circuit and operative to disconnect both said amplified exercising signals and power if the output current flow of the buffer circuit exceeds a preset limit, whereby a defective integrated circuit to be burned-in is prevented from developing destructive or disabling current loading.

5. A system for generating exercising signals as recited in claim 3 wherein said buffer circuit further includes fault detecting means responsive to the loading of the buffer circuit and operative to disconnect both said amplified exercising signals and power if the output current flow of the buffer circuit exceeds a preset limit, whereby a defective integrated circuit to be burned-in is prevented from developing destructive or disabling current loading.

* * * * *